United States Patent
Zobel

[15] 3,699,464
[45] Oct. 17, 1972

[54] DEADBAND AMPLIFIER CIRCUIT

[72] Inventor: Don William Zobel, Tempe, Ariz.
[73] Assignee: Motorola, Inc., Franklin Park, Ill.
[22] Filed: Feb. 25, 1971
[21] Appl. No.: 118,844

[52] U.S. Cl. ......................330/12, 330/17, 330/30 D, 330/69
[51] Int. Cl. ..............................H03f 3/18, H03f 3/68
[58] Field of Search .......330/69, 15, 16, 30 D, 12, 17

[56] References Cited

UNITED STATES PATENTS 3,525,881 8/1970 Hull et al. ................330/69 X
3,530,378 9/1970 Holle et al. ..............330/69 X
3,548,204 12/1970 Heller......................330/69 X

*Primary Examiner*—Alfred L. Brody
*Attorney*—Mueller & Aichele

[57] ABSTRACT

There is disclosed an amplifier with an adjustable deadband in which the common mode range is widened and in which the deadband is made easily adjustable by adjustment of the current sources coupled to the collectors of an emitter-driven push-pull output stage of the amplifier.

10 Claims, 1 Drawing Figure

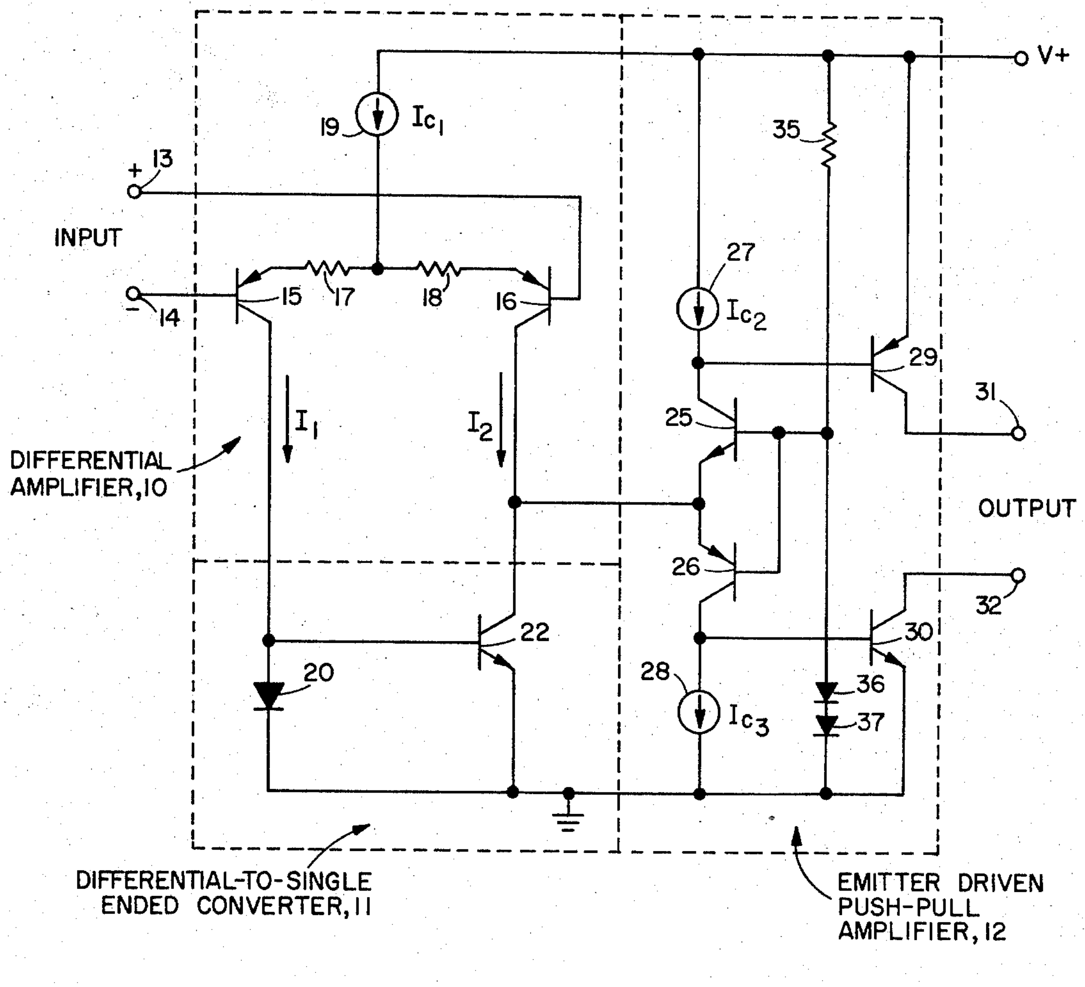
INVENTOR.
Don William Zobel
BY
Mueller & Aichele
ATTY'S.

DEADBAND AMPLIFIER CIRCUIT

BACKGROUND OF THE INVENTION

This invention relates to amplifying circuits and more particularly to an amplifier having an easily adjustable deadband.

In the past, deadband amplifiers have incorporated positive feedbacks and a variety of components in order to provide that the amplifying circuit have an amplitude adjustable deadband such that there is no output from the amplifier until such time as the amplitude of the input signal exceeds a predetermined value or amplitude band width. The problems surrounding these prior art devices center around the number of components necessary to provide for a completely adjustable deadband feature. In addition, there is the problem of the common mode range of the device.

In the subject invention a differential amplifier is combined with a differential-to-single ended converter and an emitter-driven push-pull amplifier connected across two current sources so as to provide a deadband portion of the output which is controlled in part by the current generated by these two current sources.

SUMMARY OF THE INVENTION

It is therefore an object of this invention to provide an improved deadband amplifier.

It is a further object of this invention to provide the combination of a differential amplifier, a differential-to-single ended converter and emitter-driven push-pull output stage to provide for a deadband at the output of the output stage, the deadband being readily adjustable by adjusting the currents supplied to each of the two active elements in the emitter-driven push-pull output stage.

It is a still further object of this invention to provide the combination of a differential amplifier operating in a current mode which is coupled via a differential-to-single ended converter to the emitters of an NPN-PNP type emitter-driven push-pull amplifier in which the collectors are supplied with currents generated by two current sources which are set so as to adjust the deadband of the amplifier.

Other objects of this invention will be better understood upon reading the description of the accompanying drawing.

BRIEF DESCRIPTION OF THE DRAWING

The sole drawing is a schematic diagram of an improved deadband amplifier circuit showing the differential amplification section, the differential-to-single ended conversion section and the emitter-driven push-pull output stage for the amplifier.

BRIEF DESCRIPTION OF THE INVENTION

There is disclosed a deadband amplifier comprising the combination of a differential amplifier to which an input signal is applied coupled to a differential-to-single ended converter whose output is proportional to the difference in current through each output leg of the differential amplifier. The output of the differential-to-single ended converter is a current which is applied to the emitters of an NPN-PNP emitter-driven push-pull amplifier. The collectors of these two transistors are coupled to current sources which generate a fixed current. When the current imbalance between the two output legs of the differential amplifier exceeds a certain threshold, the current through the emitter-driven push-pull output stage increases to the point at which the current generated by the current sources is exceeded. The current excess drawn by the emitter-driven push-pull output stage is drawn from the bases of PNP and NPN output transistors thereby turning these output transistors ON. When the current through the emitter-driven push-pull amplifier exceeds the current generated by the two current sources, the output transistors are driven by that portion of the input signal which exceeds a predetermined amplitude threshold.

DETAILED DESCRIPTION OF THE INVENTION

Referring to the sole figure, there is shown a schematic diagram of a deadband amplifier comprising a differential amplifier 10, a differential-to-single ended converter 11, and an emitter-driven push-pull amplifier output stage 12. The inputs to the differential amplifier are shown with the appropriate polarity at 13 and 14. These inputs are coupled to the bases of emitter-coupled PNP transistors 15 and 16 which comprise the differential amplifier. The emitters of the transistors 15 and 16 are interconnected by resistive elements 17 and 18. A current source 19 provides a current $Ic_1$ at the midpoint between the resistive elements 17 and 18. The collector of the PNP transistors 15 and 16 are coupled to ground by diode 20 and an NPN transistor 22. Circuit elements 20 and 22 are matched devices insofar as the voltage drop across the diode 20 is equal to the base-to-emitter voltage drop across the transistor 22 at equal currents. As such these two devices have junction characteristics which are matched such that when equal signals are applied to the bases of the transistors 15 and 16 equal currents $I_1$, $I_2$ flow in the output legs of the differential amplifier. Thus no current will be either drawn from or driven to emitter-driven push-pull amplifier 12. Should there be any mismatching between the diode 20 and the transistor 22, this mismatching can be compensated for by the appropriate setting of the resistive elements 17 and 18, in conjunction with the current source 19.

The output of the differential-to-single ended converter 11 is shown connected to the emitters of the emitter-driven push-pull transistors 25 and 26 in the output stage 12. It will be appreciated that a differential voltage on the bases of the PNP transistors 15 and 16 will result in an imbalance in their collector currents. This imbalance is directly proportional to the voltage differential. Since the diode 20 and the transistor 22 are matched devices and since the same amount of current flowing through the diode also flows through the transistor, any current generated by the transistor 16 at its collector, which is in excess of the current generated by the transistor 15 at its collector, flows through the transistor 26 in the output stage 12. This corresponds to a condition in which $I_2$ is greater than $I_1$. If $I_2$ is less than $I_1$, the transistor 25 in the output stage 12 conducts to make up the difference. Thus if the signals at the inputs 13 and 14 are equal, $I_1$ equals $I_2$ and the current at the emitters of the transistors 25 and 26 is zero. If there is a current imbalance, then the difference in current either flows through the transistor 26 or the transistor 25 depending on the polarity of the signal at the inputs 13 and 14.

When there is a current imbalance, one or the other of the transistors 25 or 26 will start to conduct current. The collector of the transistor 25 is coupled to the current source 27 which is in turn coupled to a positive source of voltage labelled V+. The collector of the transistor 26 is also coupled through a current source, shown diagrammatically at 28, which is coupled thereafter to ground. These current sources as well as current source 19 and resistors 17 and 18 are set so as to adjust the aforementioned deadband. In one configuration, the current generated by each of current sources 27 and 28 was set to be equal to 75 microamps and current source 19 generated 200 microamps with $R_{17} = R_{18} = 855$ ohms such that the deadband at the input terminals 13 and 14 was equal to 150 millivolts.

In the operation of the output section 12, when there is a current differential between $I_1$ and $I_2$ in which $I_1$ is greater than $I_2$, the current begins to flow through the transistor 25. The current, $Ic_2$, which the transistor 25 is drawing is supplied by the current source 27 such that until the transistor 25 draws more than 75 microamps, all of this current is supplied by the current source 27. When, however, the transistor 25 starts to conduct more current than that available ($Ic_2$) at the current source 27, which in this case is 75 microamps, it starts drawing current from the base of the output transistor 29 so as to turn it ON. The current in excess of 75 microamps, which is drawn from the base of the transistor 29, is proportional to the current difference in the output legs of the differential amplifier 10 which is in turn directly proportional to the differential voltage applied at the terminals 13 and 14, in excess of a predetermined value.

When, however, $I_1$ is less than $I_2$ the current differential produced thereby causes the current to flow through the transistor 26. When this current reaches that generated by the current source 28 (i.e. $Ic_3$) and exceeds this value, it gives the excess current to the base of the output transistor 30, thus biasing the transistor 30 into conduction. The current at the base of the transistor 30 is also proportional to he current difference at the output legs of the differential amplifier which is in turn also proportional to the differential voltage applied between terminals 13 and 14 in excess of a predetermined value. Thus, the output of the deadband amplifier at 31 and 32 is a signal which is proportional only to those differential amplitude swings at the input terminals 13 and 14 which exceed a predetermined voltage either in the positive or negative directions. The output of the deadband amplifier is therefore a signal having amplitude variations corresponding to the differential amplitude variations of the input signal only when the input differential signal exceeds a predetermined threshold.

The use of the following formula allows calculation of deadband width.

$$V_{os} = 2nkTln\left[\frac{I_A + I_B}{I_A - I_B}\right] + RI_B$$

where $V_{os}$ = the differential deadband voltage between 13 and 14

$k$ = Boltzman's constant $T$ = Temperature in degrees Kelvin $R = R_{17} = R_{18}$ (if symmetrical deadband)

$I_A$ = the current generated by the current source 19

$I_B$ = the current generated by the current sources 27 or 28 (if symmetrical deadband)

$n$ = constant dependent on the characteristics of the transistors 15 and 16

In one embodiment $n = 2.065$.

As can be seen from the equation, raising R will increase the differential deadband. Also increasing $I_B$ while holding $I_A$ constant will also increase deadband.

The common mode range of the device is defined as follows: Any voltage appearing simultaneously at 13 and 14 with respect to ground is considered a common mode voltage. The common mode range is defined as the maximum minus the minimum common mode voltage one is able to apply to the circuit without saturating any of the active devices. The minimum common mode voltage is made lower in the subject circuit to increase the common mode range.

It will be appreciated that in order to maximize the common mode range of the device that the bases of the transistors 25 and 26 are to be biased at a point two base-to-emitter voltage drops above ground. This potential is applied to the bases of the transistors 25 and 26 by means of the resistor 35 in series with the diodes 36 and 37, each having a voltage drop thereacross equal to the base-to-emitter voltage drop of one of the transistors 25 and 26. The reason for biasing the bases of these transistors at two base-to-emitter voltage drops above ground is that this is the minimum voltage one can use and still insure that the transistor 26 will not go into saturation while turning on the transistor 30. A minimum voltage here maximizes the common mode range of the input differential amplifier 10 by allowing the voltage at the input 13 to go to the lowest potential possible and still conduct current to the transistor 26 without saturating the transistor 16.

In summary, there is provided a deadband amplifier having an improved common mode range with a minimized number of components. In addition, because of the current source biasing of the device, the deadband amplifier has an exceptionally high gain. The reason for the high gain is attributed to the constant current sources because once the current source magnitude $Ic_2$ or $Ic_3$ has been satisfied a very high impedance is seen looking into them. Therefore, almost all the excess current goes into either the base of the transistor 30 or from the base of the transistor 29 which gives a high voltage gain when a reasonably high load impedance is connected to the output terminals 31 and 32.

It will be appreciated that this device may be used with input signals having both positive and negative differential input swings or may be used where the input signal rises above a zero differential potential and does not fall below this potential. As such the subject circuit operates as a threshold detector in the sense that there is no output signal until an input threshold has been reached with generates a sufficient current differential at the output of the differential amplifier 10 to cause the transistors 25 and 26 to conduct enough current to satisfy The The constant current sources. However, the output of the amplifier is linear with respect to the input signal at small differential input amplitudes above this threshold. The subject circuit is therefore considerably more than a threshold detector insofar as it reproduces faithfully the input signal which is above a predetermined threshold rather than merely indicating the presence of a signal above this threshold.

What is claimed Is:

1. An adjustable deadband amplifier circuit, adapted for connection between a first and second power supply terminal, comprising:

a. a differential amplifier, having a pair of input terminals for receiving an input voltage signal, a first output leg for conducting a first current output and a second output leg for conducting a second current output, the current imbalance between the first and second currents being proportional to the voltage difference between the input terminals;

b. a differential-to-single-ended converter having an output terminal, the converter being electrically connected to receive the first and second current outputs for providing a single signal at the output terminal whose amplitude is representative of the current imbalance and the polarity of the voltage signal at each of the input terminals;

c. current supplying and diverting means electrically connected to the output terminal of the converter, responsive to the single signal, to supply current to the converter when the amplitude of the single signal is below a prescribed level and to divert current from the converter when the amplitude of the single signal is above the prescribed level; and d. output means electrically connected to the current supplying and diverting means, responsive to the supplied current and the diverted current, for producing an output signal when either the supplied current or the diverted current exceed an adjusted value.

2. The current of claim 1 wherein the circuit supplying and diverting means further comprise:

c.

i. a first adjustable current source, electrically connected to the first supply terminal;

ii. a second adjustable current source, electrically connected to the second supply terminal;

iii. a first current control electrically connected to the first current source for causing the first current source to provide the supplied current; and iv. a second current control electrically connected to the second current source for causing the second current source to provide the diverted current.

3. The circuit of claim 2 wh-rein the output means further comprise:

d.

i. a first output amplifier having an input control terminal connected between the first current source and the first current control, for providing an output signal when the supplied current is exceeded; and ii. a second output amplifier having an input control terminal connected between the second current source and the second current control for providing an output signal when the diverted current is exceeded.

4. The circuit of claim 2 wherein the differential-to-single-ended converter further comprises:

b.

i. an NPN transistor, having its collector connected to the second output leg, its emitter connected to he second supply-terminal and its base connected to the first output leg; and ii. a diode having its anode connected to the first output leg and to the base of the NPN transistor, and the other electrode connected to the supply terminal, the diode characteristic being matched to the NPN transistor characteristic to insure that the current flowing between the diode and the second supply terminal is equal to the current flowing between the NPN transistor and the second supply terminal.

5. The circuit of claim 3 wherein the differential-to-single-ended converter further comprises:

b.

i. an NPN transistor, having its collector connected to the second output leg, its emitter connected to the second supply terminal and its base connected to the first output leg; and ii. a diode having its anode connected to the first output leg and to the base of the NPN transistor, and the other electrode connected to the supply terminal, the diode characteristic being matched to the NPN transistor characteristic to insure that the current flowing between the diode and the second supply terminal is equal to the current flowing between the NPN transistor and the second supply terminal.

6. The circuit of claim 3 wherein the first current control is an NPN transistor and the second control is a PNP transistor, the output of the converter being connected to the emitters of the current control transistors, the collectors of the first and second current control transistors being connected respectively to the first and second adjustable current sources, and the bases of the first and second current control transistors being connected to a common bias point between the first and second supply terminal.

7. The circuit of claim 6 wherein the first output amplifier is a PNP transistor having its base connected to the collector of the first current control transistor and having its emitter connected to the first supply terminal, and wherein the second output amplifier is an NPN transistor having its base connected to the collector of the second current control transistor and having its emitter connected to the second supply terminal, the output signal being taken from the collectors of both output amplifier transistors.

8. The circuit of claim 7 wherein the common mode range of the circuit is increased by providing a bias voltage at the common bias point equal to the sum of the base-to-emitter voltage drops across the current control transistors.

9. The circuit as recited in claim 4 wherein said differential amplifier includes two PNP transistors, a pair of series coupled resistors coupled between the emitters of said last mentioned PNP transistors, and a current source coupled at one end to the mid point between said resistors and adapted to be coupled at its other end to the first supply terminal, the deadband of said circuit being adjusted by changing the value of the current generated by any of said current sources or by changing the resistance of said resistors.

10. The circuit as recited in claim 9 wherein the voltage differential at said input terminals at which an output signal is generated is given by the formula:

$$V = 2nkT + ln\left[\frac{I_{C_A} + I_{C_B}}{I_{C_A} - I_{C_B}}\right] + RI_{C_B}$$

where $n$ = constant of proportionality $k$ = Boltzman's constant, $T$ = temperature in degrees Kelvin, $ln$ = natural log, $Ic_A$ = the current generated by either of the current sources coupled to the sides of said push-pull amplifier, said current sources generating equal currents, $Ic_B$ = the current generated by the current source associated with said differential amplifier, and $R$ = resistance of either of said resistors, said resistors having the same resistance.

* * * * *